United States Patent
Yamashita et al.

[11] Patent Number: 5,806,574
[45] Date of Patent: Sep. 15, 1998

[54] PORTABLE CLOSED CONTAINER

[75] Inventors: Teppei Yamashita; Masanao Murata; Tsuyoshi Tanaka; Hitoshi Kawano; Teruya Morita, all of Ise, Japan

[73] Assignee: Shinko Electric Co., Ltd., Toyko, Japan

[21] Appl. No.: 565,945

[22] Filed: Dec. 1, 1995

[51] Int. Cl.⁶ .................................................. B65B 31/00
[52] U.S. Cl. ................................ 141/63; 141/48; 141/63; 141/67; 141/98; 414/217
[58] Field of Search ................... 141/63, 48, 67, 141/70, 98; 414/217, 220, 221, 292, 935, 940; 118/500

[56] References Cited

U.S. PATENT DOCUMENTS

| | | | |
|---|---|---|---|
| 4,724,874 | 2/1988 | Parikh et al. | 141/98 |
| 4,995,430 | 2/1991 | Bonora et al. | 141/98 |
| 5,169,272 | 12/1992 | Bonora et al. | 414/217 |
| 5,222,307 | 6/1993 | Oba et al. | 34/13 |
| 5,292,393 | 3/1994 | Maydan et al. | 156/345 |
| 5,303,482 | 4/1994 | Yamashita et al. | 34/80 |
| 5,351,415 | 10/1994 | Brooks et al. | 34/389 |
| 5,363,867 | 11/1994 | Kawano et al. | 134/95 |
| 5,370,491 | 12/1994 | Bonora et al. | 414/217 |
| 5,378,283 | 1/1995 | Ushikawa | 414/217 |
| 5,482,161 | 1/1996 | Williams et al. | 414/217 |

*Primary Examiner*—Robert M. Fetsuga
*Assistant Examiner*—Timothy L. Maust
*Attorney, Agent, or Firm*—Bacon & Thomas

[57] ABSTRACT

A portable closed container has a container body, and a lid for opening and hermetically closing the opening of the container body, in which an internal atmosphere thereof is replaced with an inner atmosphere suitable for an article contained in the container through a gas purging operation. The container is improved such that the lid is a hollowed body with at least one purging wall hole.

14 Claims, 8 Drawing Sheets

(PRIOR ART)

(PRIOR ART)

(PRIOR ART)

(PRIOR ART)

PORTABLE CLOSED CONTAINER

BACKGROUND OF THE INVENTION

1. Field of the Invention

The present invention relates to a portable closed-container of good gas-purging characteristics, which is used in a system for manufacturing semiconductor wafers, LCD panels, reticles, discs, and the like.

2. Related Art

An example of this type of the manufacturing system is shown in FIG. 4.

In the figure, reference numeral 1 designates a surface processing equipment for processing the surface of a semiconductor wafer; 2, wafer inspecting equipment; 3, a self-propelled transfer robot; 4, a wafer stocker; 5, a wafer cleaning device; 6, a stacker crane; 7, a linear induction motor type transferring device; 8, a portable closed container containing a plural number of wafer cassettes 9 (FIG. 6) in a stacked fashion.

In the system (clean room), the wafer cassettes 9 within the system (clean room) are transported and stored in a state that these are put in the portable closed container 8 in order to prevent dirty particles from sticking onto the wafer cassettes 9.

In FIGS. 5 and 6, reference numeral 8 designates a bottom-lid type portable closed container; and character W indicates a wafer.

Numeral 10 represents a container body of the portable closed container 8. The container body 10 has an opening 12 with a flange 13 projected from the edge defining the opening.

Numeral 20 designates a hollow bottom lid of which the upper surface serves as a cassette support surface 21. As shown in FIG. 7, a locking/unlocking mechanism is contained in the container body. To lock and unlock, a rod (latching bar) 24 is moved into and from a recess 14, through a hole 23 of the side wall 22. The recess 14 is formed on the inner surface of the flange 13 of the container body 10.

When the locking/unlocking mechanism is operated for locking, the hollow bottom lid 20 is brought into pressure contact with the bottom of the flange 13, with a sealing member 15 intervening therebetween, whereby the container body 10 is hermetically sealed to isolate the inside thereof from the air.

Reference numeral 16 stands for a handle. Flat peripheral leg 21B is formed on the peripheral part of the bottom of the hollow bottom lid 20 so as to bound Volume B within the leg and under the bottom of the lid.

In FIG. 7, the plate-like latching bar 24 includes a rolling element 24a, and is cantilevered in such a manner that it longitudinally movable and tiltable.

Reference numeral 25 designates a cam; 26, a fulcrum member; and 27, a spring.

A cam shaft 28 is extended from the center of the upper wall of a lifting table 31 (to be described later) into the hollow bottom lid 20. The cam shaft 28 is spline-engaged with the cam 25 when the hollow bottom lid 20 is located on the lifting table 31 in a coaxial fashion.

The lifting table 31 incorporates a cam shaft drive mechanism 29 thereinto, which turns the cam shaft 28 through a predetermined angle.

The particle contamination of the wafer W has been one of the major problems in this field.

The influence by oxygen in the air, the native oxidation film on the wafer surface, and organic gas in the air becomes problematic, as the integration of the semiconductor integrated circuit proceeds.

To prevent the growth of the native oxidation film and the contamination by the organic gas, necessity is created to carry out movement, transportation, processing and the like of the wafers W in inert gas atmosphere (e.g., $N_2$ gas, and dry air).

Such an $N_2$ gas atmosphere that the concentration of $O_2$ or $H_2O$, or both of them if necessary, is 10 ppm or less is required at present.

To meet the requirement, a gas purging mechanism (gas purging station) is installed in the surface processing equipment 1, the wafer stocker 4 and the like, as shown in FIG. 8.

In FIG. 8, reference numeral 1A designates a port formed at a proper location on the wall of the body case of the surface processing equipment 1. Numeral 30 designates a lifting device and numeral 31, a lifting table for the lifting device 30, which also serves a port door for hermetically closing an opening 32 of the port 1A.

Numeral 33 designates a sealing member. Numeral 34 indicates a purge gas feed path, which opens at one end to the opening 32 and is connected at the other end to an inert gas cylinder (not shown) through a pipe 35.

Numeral 36 represents an exhaust path 36, which opens at one end to the opening 32 and is connected at the other end to a pipe 37 extended to the outside of the surface processing equipment 1. Numerals 38 and 39 designate valves.

The hollow bottom lid 20 of the portable closed container 8 is a hollowed body with an inner space. The inner space thereof communicates with the container body 10 through the hole 23 (FIG. 10) through which the latching bar 24 is moved forward and backward.

With this construction, when the gas of the portable closed container 8 is purged, air within the hollow bottom lid 20 is also replaced with the inert gas.

In this case, air is exhausted through the hole 23 as indicated by a solid line with an arrow head (1). Therefore, much time is taken for the air purging operation.

A gap B is present between the lower surface of the hollow bottom lid 20 and the upper surface of the lifting table 31. Air in the gap B is also replaced with the inert gas.

In this case, the gas flows through a gap C between the lifting table 31 and the leg 21B of the hollow bottom lid 20. This gas purging operation also takes much time.

With such a construction, if the gas of the container body 10 is to be purged quickly, the gas purging operation through the gaps A and B takes much time. As a result, the gas purging characteristic of the whole system is poor.

SUMMARY OF THE INVENTION

The present invention is made to solve the above problems and has an object to provide a method for purging gas of a portable closed container, which is able to remarkably reduce the gas purging time when comparing with the conventional one.

To achieve the above object, there is provided a portable closed container having a container body, and a lid for opening and hermetically closing the opening of the container body, in which an internal atmosphere thereof is replaced with an inner atmosphere suitable for an article contained in the container through a gas purging operation, characterized in that the lid is a hollowed body with at least one purging wall hole.

In the portable closed container of the present invention, the gas purging operation is performed at a purging station with a specific table when the container is transported, the wall hole is opened to the container placing surface of the specific table, and the specific table includes a purging discharging path opened to the container placing surface.

In the portable closed container of the present invention, the lid includes a locking/unlocking mechanism having a latching bar that is moved to and from the container body.

In the present invention, during the gas purging operation, air staying in the lid of the container is purged out of the container, through the purging wall hole. The air in the gap between the lid and the specific table is also purged to outside through the purging exhaust path. The gas purging time of the whole container is remarkably reduced when comparing with the conventional container.

DETAILED DESCRIPTION OF THE PREFERRED EMBODIMENT

An embodiment of the present invention will be described with reference to the accompanying drawings.

Figure 1:
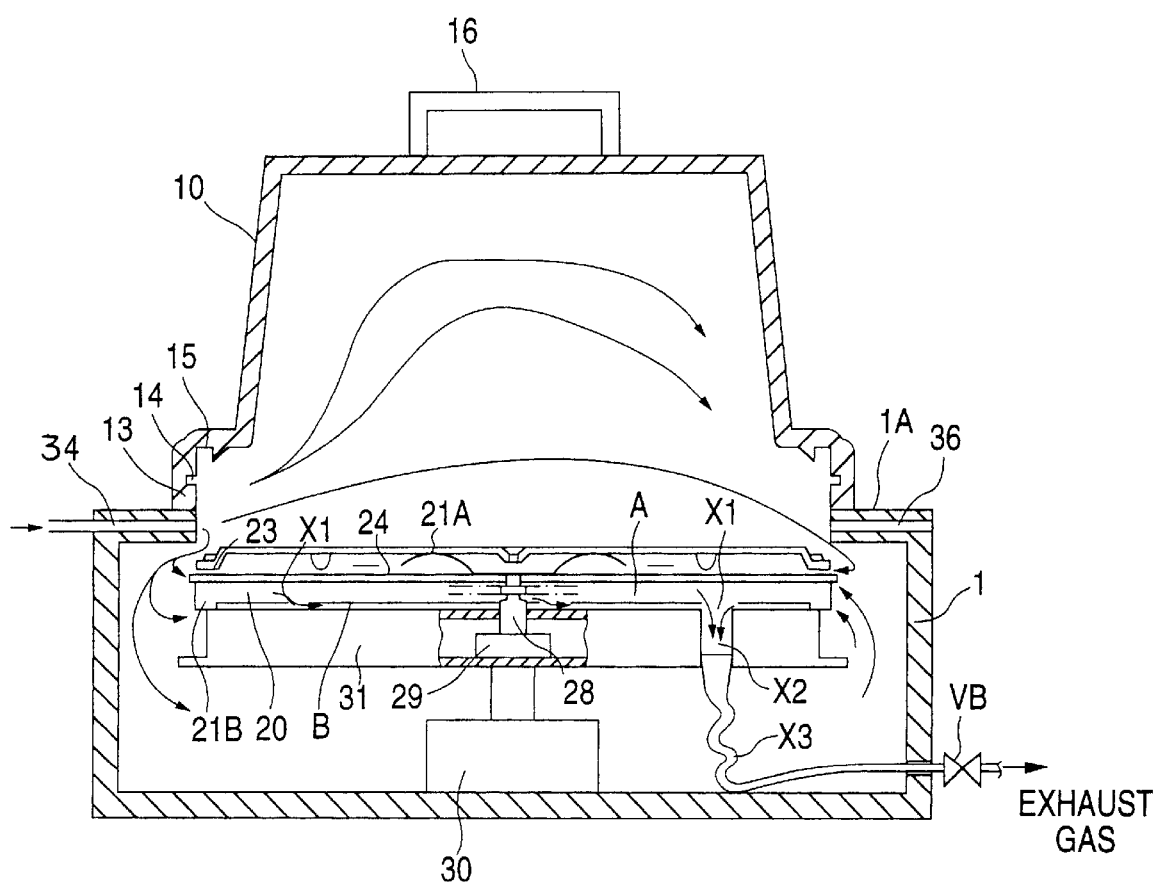
FIG. 1 is a longitudinal sectional view showing a first embodiment of the present invention.
Figure 2:
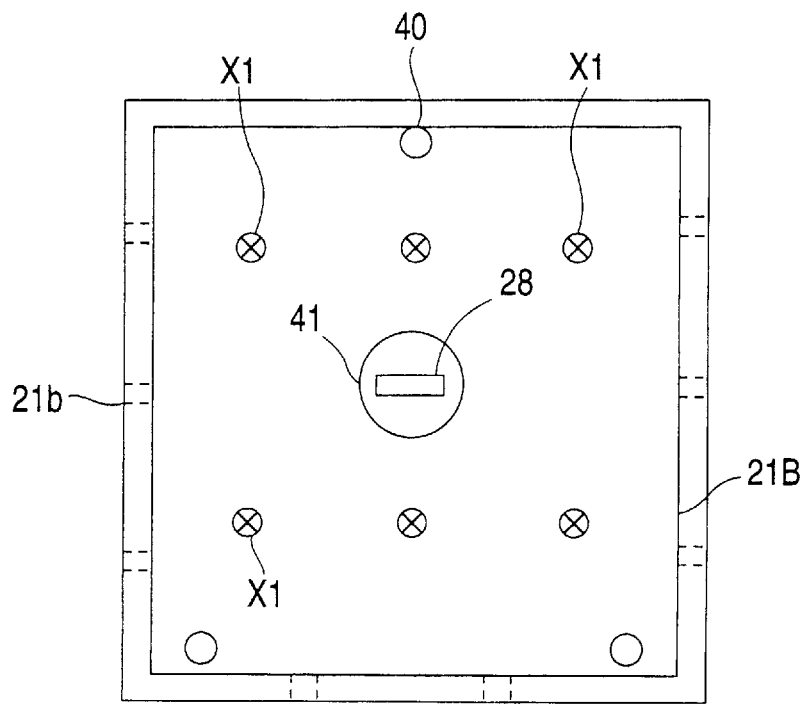
FIG. 2 is a bottom view showing the bottom lid in the embodiment.
Figure 3:
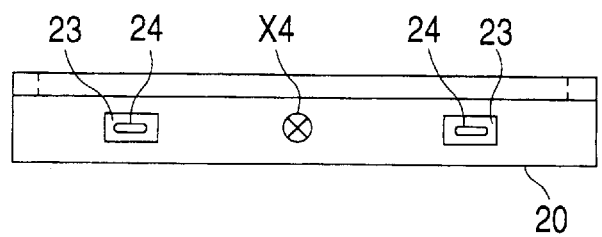
FIG. 3 is a longitudinal sectional view showing another embodiment of the present invention.
Figure 4:
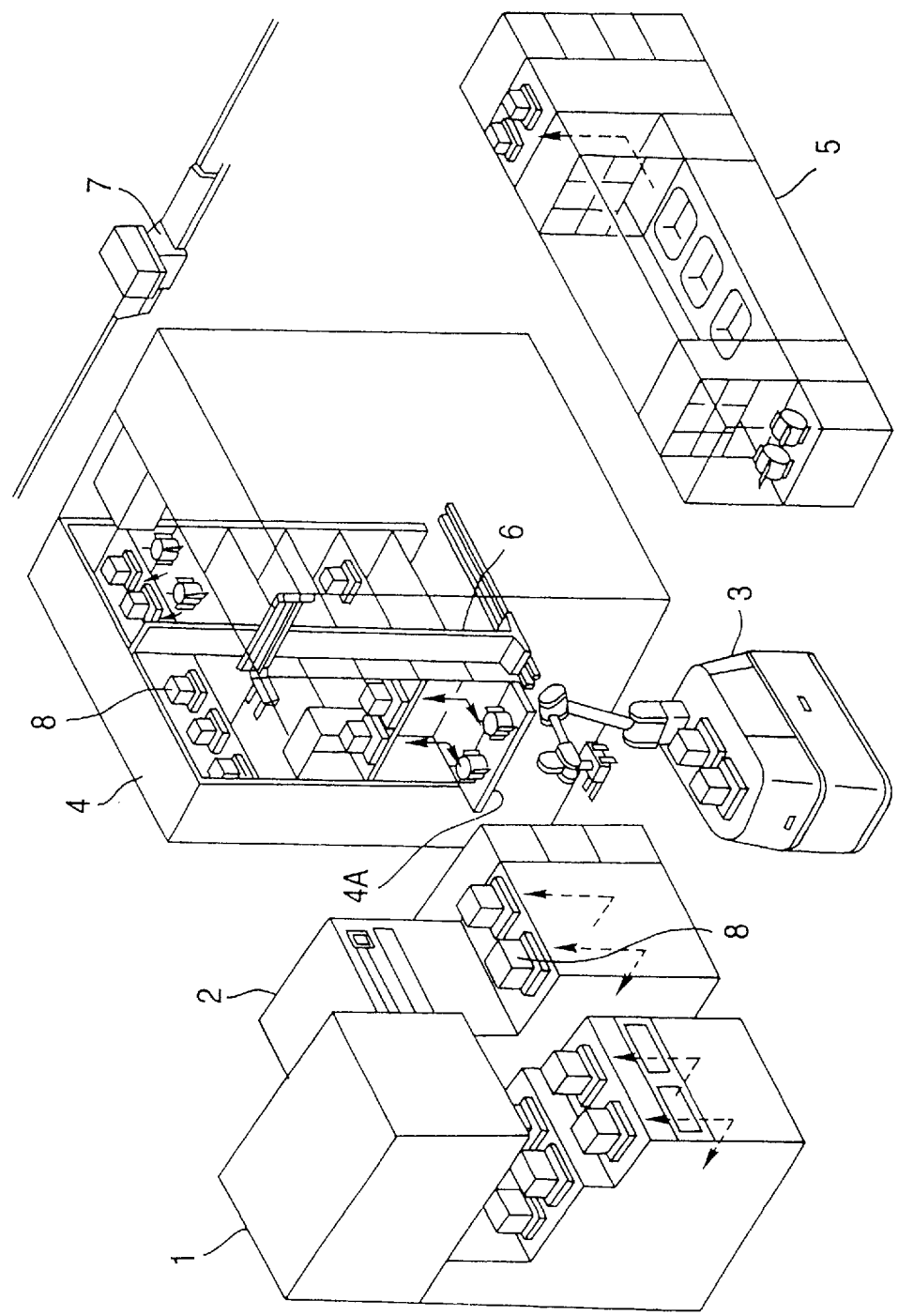
FIG. 4 is a view showing a semiconductor manufacturing system.
Figure 5:
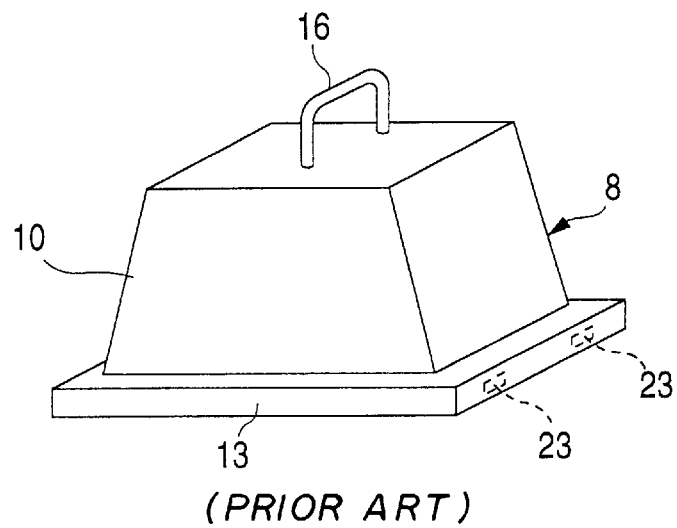
FIG. 5 is a view showing an external appearance of a conventional portable closed container.

In FIG. 1, one or a plural number of wall holes X1 which serve as a purging path, is formed in the bottom of the hollow bottom lid 20. The wall holes X1 are opened to the gap B between the hollow bottom lid 20 and the upper surface of the lifting table 31 (the bottom view thereof is illustrated in FIG. 2).

An air path X2, formed in the lifting table 31, is opened at one end to the volume B, and at the other end on the lower surface of the lifting table 31.

A flexible pipe X3 is connected at one end to the other end of the air path X2, and the other end of the flexible pipe X3 is extended to outside the body case 1A.

The air path X2 and the flexible pipe X3 serve as exhaust paths. VB indicates a valve.

Figure 6:
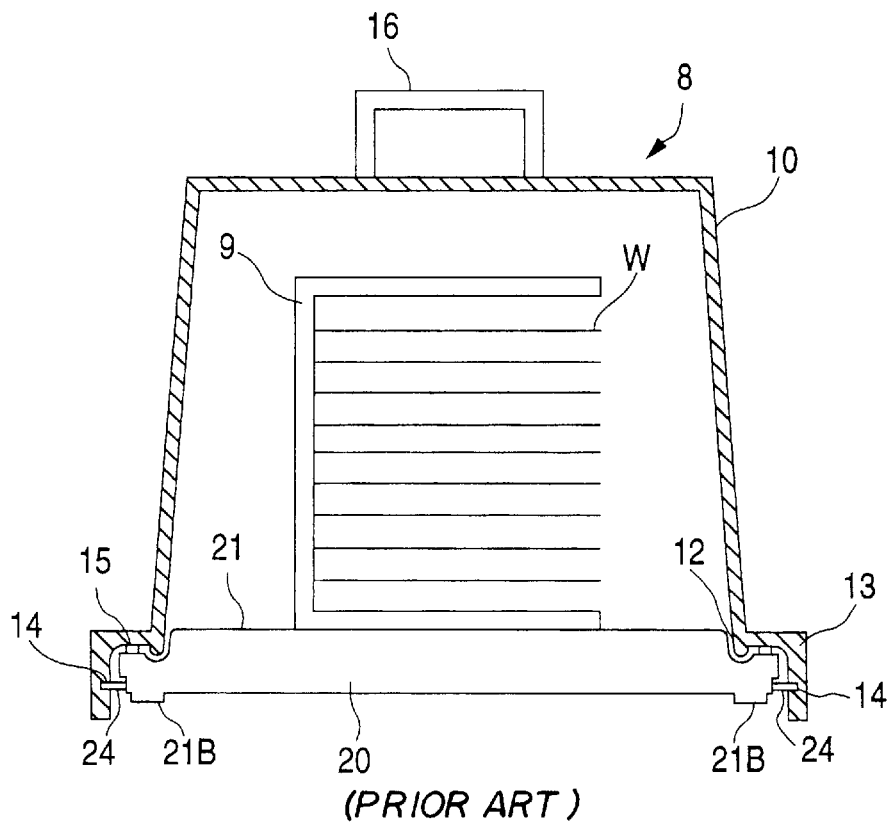
FIG. 6 is a cross sectional view showing a conventional portable closed container.
Figure 7:
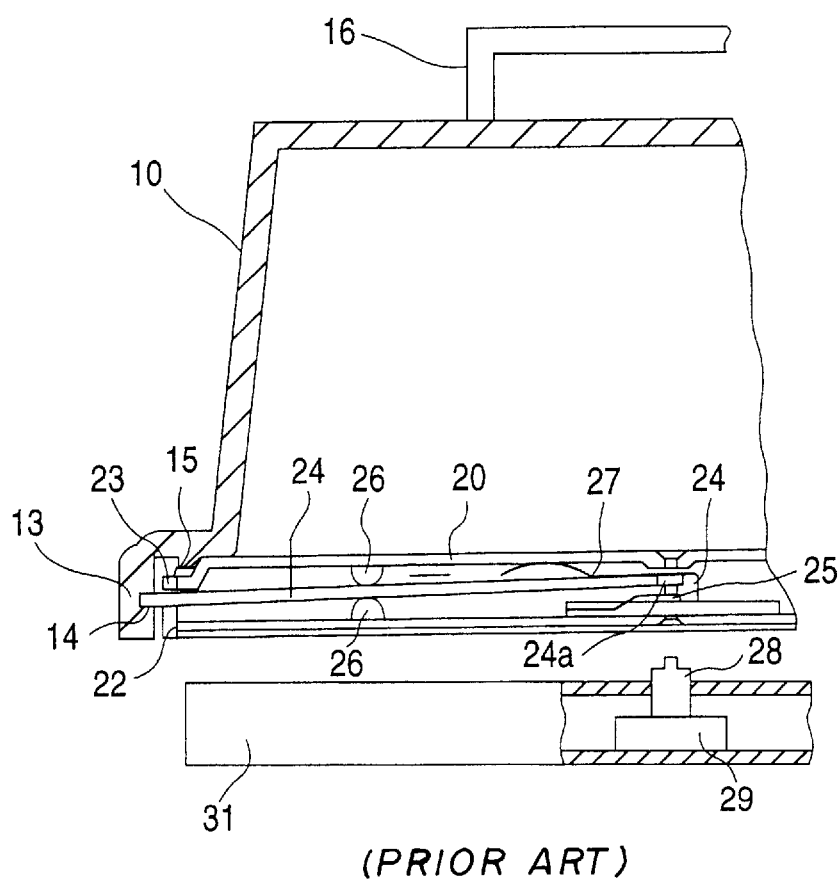
FIG. 7 is a view useful in explaining a conventional locking/unlocking mechanism.
Figure 8:
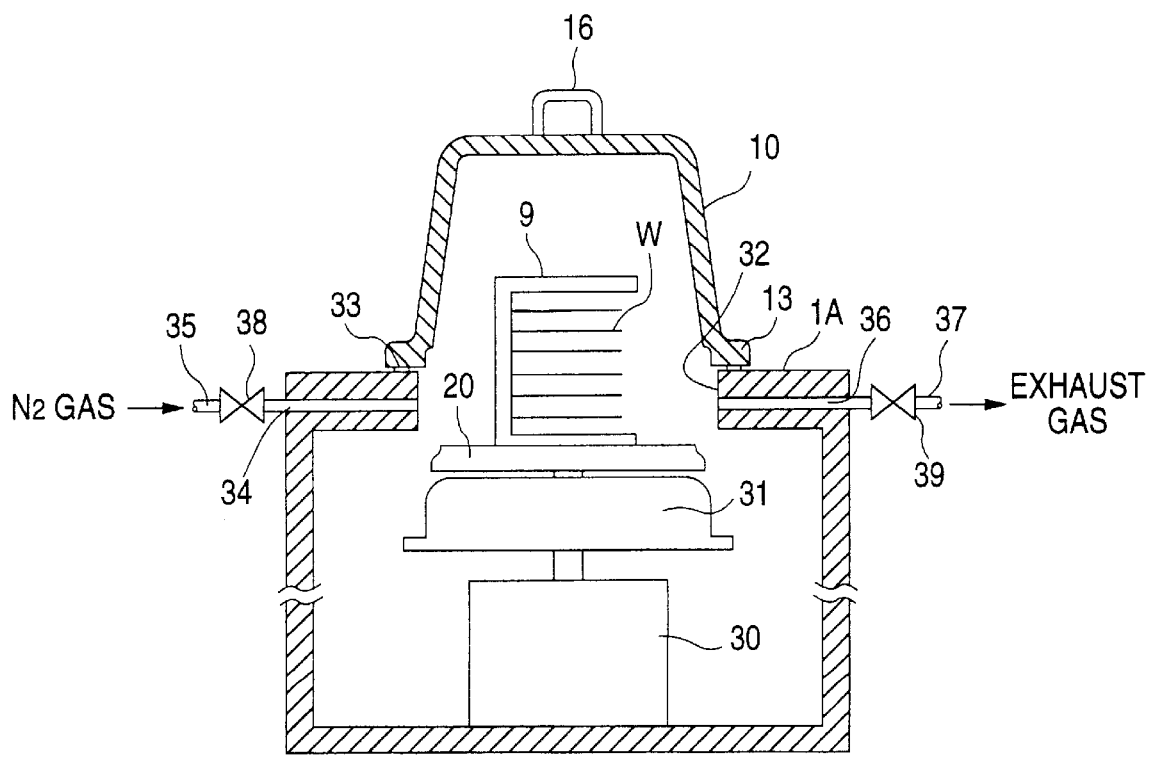
FIG. 8 is a view for explaining a gas purging mechanism in a conventional portable closed container.
Figure 9:
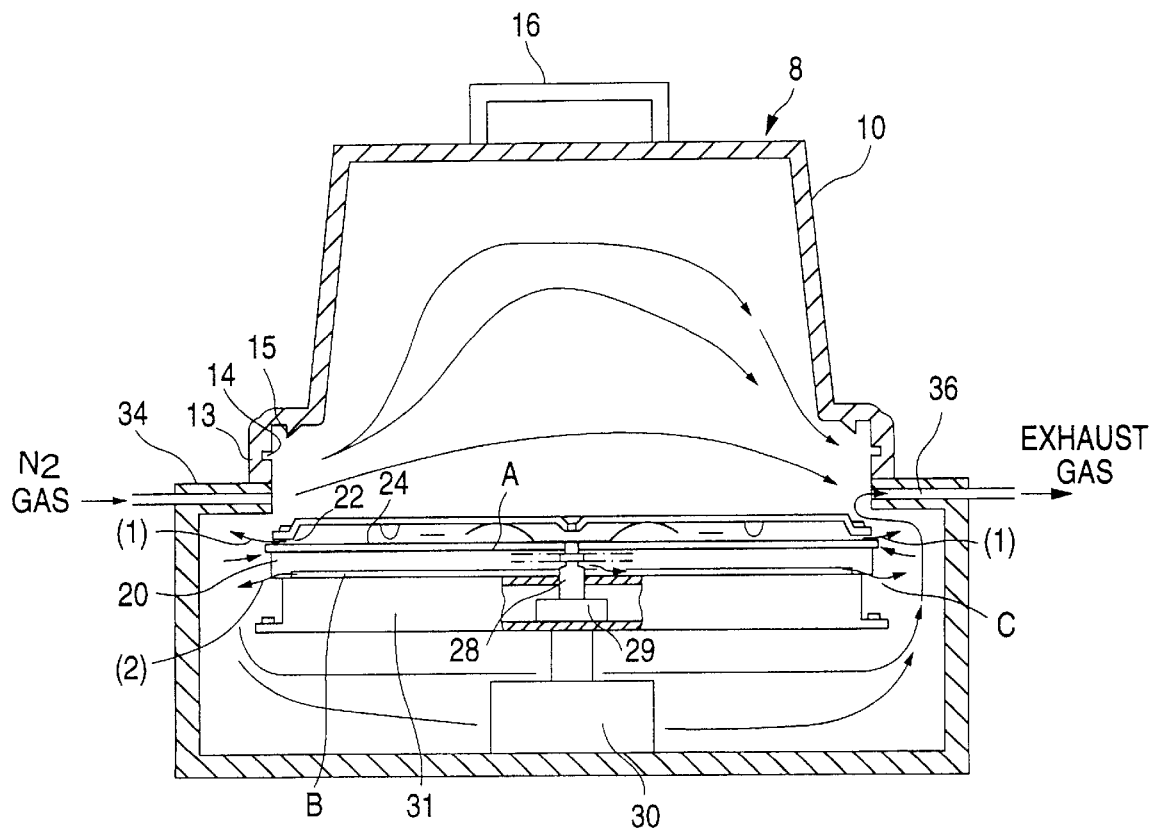
FIG. 9 is a view for explaining the problems of the conventional portable closed container.

The remaining construction of the present bottom-lid type portable closed container is the same as of the conventional one shown in FIGS. 6 to 8.

In FIG. 2, reference numeral 40 designates positioning holes which receive positioning pins (not shown). Numeral 41 designates holes which receive pins for opening and closing the lid.

Figure 10:
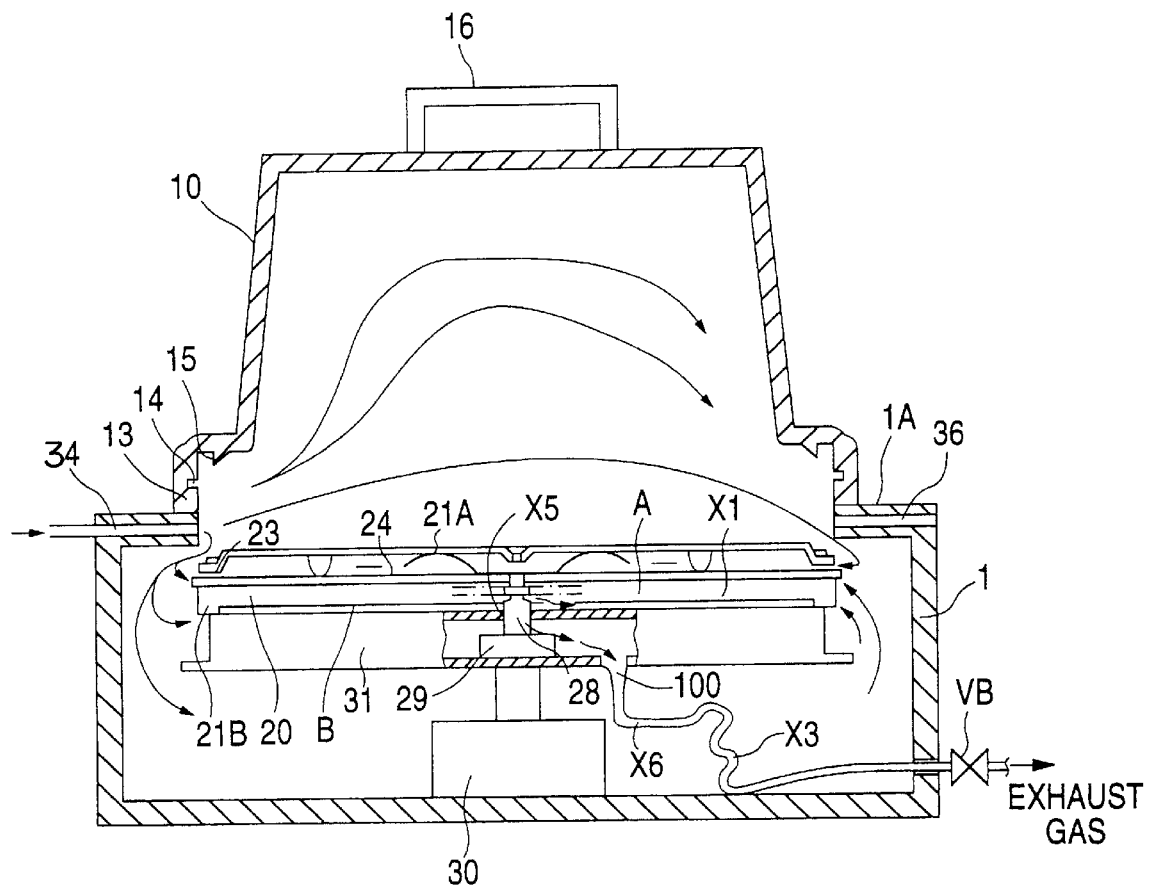
FIG. 10 is a longitudinal sectional view showing a second embodiment of the present invention.

In the present embodiment, at the time of gas purging, inert gas, for example, $N_2$ gas, enters the inside A of the hollow bottom lid 20, through the hole 23 (FIG. 10). The inert gas, higher in pressure than the atmosphere, compels air to flow from the hollow bottom lid 20 to the volume B, through the wall holes X1. The air, together with the air remaining in the volume B, is discharged to outside the container, through the air path X2 and the flexible pipe X3.

As described above, the paths for guiding the air in the inside A of the hollow bottom lid 20 and the air in the volume B between the hollow bottom lid 20 and the cassette support surface 21 to outside the container, is provided in the present embodiment. With provision of these discharging paths, air is quickly purged from those spaces.

As shown in FIG. 2, at least one air passing hole X4, which is different from the hole 23 through which the latching bar 24 advances and retracts, may be formed in the peripheral wall of the hollow bottom lid 20, in addition to the holes 41.

At least cut-out air path 21b, as indicated by dotted lines in FIG. 2, may be formed on the lower face of the flat leg 21B of the hollow bottom lid 20.

In the above-mentioned embodiment, the vertical movement of the lifting table 31 is used for the vertical movement of the hollow bottom lid 20 for opening and closing the portable closed container 8.

Sometimes the portable closed container 8 is put on a specific fixing table and the container body 10 is vertically moved.

In this case, the air path X2 and the flexible pipe X3 (not necessary flexible) are formed in the fixing table.

Figure 11:
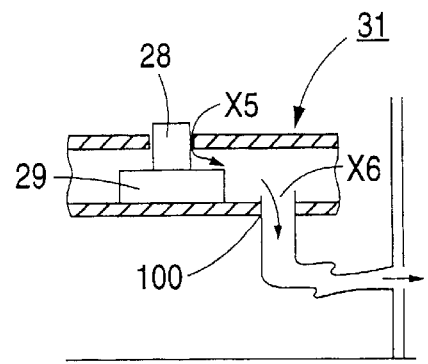
FIG. 11 is an enlarged view showing purging discharging holes of the second embodiment of the present invention.

FIGS. 10 and 11 show a second embodiment of the present invention. The second embodiment is substantially the same as the first embodiment. Thus, the following description describes the different portion between the first and second embodiments.

The lifting device 30 lifts up and down the lifting table 31 of the purging station and rotates the cam shafts 28 and 29. After rotating the cam shafts 28 and 29, the latch plate 24 is drawn off to disengage the container body 10. A space $X_5$ defined between the cam and the lifting table 31 serves as a purging discharging hole. Further, the lifting table 31 is provided with a discharging path connecting hole 100 which is connected to an air path $X_6$ through the flexible pipe $X_3$.

In view of this configuration, the gas purging operation is smoothly performed via the volume B between the hollow bottom lid 20 and the lifting table 31, an inner space of the hollow bottom lid 20 and an inner space of the lifting table 31.

While the present invention is applied to the bottom lid type closed container in the above-mentioned embodiment, it is evident that the invention is applicable for the top-lid type portable closed container. In this case, the air paths are formed in the top lid.

As seen from the foregoing description, during the gas purging operation, air staying in the lid of the container is purged out of the container, through the purging wall holes. The gas purging time of the whole container is remarkably reduced when comparing with the conventional container.

What is claimed is:

1. A portable closable container for semi-conductor wafers, comprising:

a container body having an opening;

a lid for hermetically closing and sealing the opening, the lid comprising a hollow body having a bottom surface and a peripheral support leg on the bottom surface extending below the bottom surface to effectively create a volume beneath the lid bottom surface bounded by the peripheral support leg;

at least one unrestricted gas purge opening in the bottom surface within the area of the bottom surface bounded by the peripheral support leg and in communication with said volume;

whereby the interior of the lid and the volume beneath the bottom surface bounded by the peripheral support leg may be purged of air by circulation of purge gas via the unrestricted opening when the lid is supported on a surface by the support leg to effectively enclose said volume beneath the bottom surface bounded by the peripheral support leg.

2. The container according to claim 1, said lid bottom including a sidewall having at least one latch receiving opening therein, and at least one additional gas purge opening in said sidewall that does not constitute a latch receiving opening.

3. The container according to claim 1, including at least one cut-out gas purging path formed on the lower side of said peripheral support leg.

4. A gas purging system for purging a portable closeable container for semi-conductor wafers, comprising:

a container body having an opening;

a lid for hermetically closing and sealing the opening, the lid comprising a hollow body having a bottom surface and a peripheral support leg on the bottom surface extending below the bottom surface to effectively create a volume beneath the lid bottom surface bounded by the peripheral support leg;

at least one unrestricted gas purge opening in the bottom surface within the area of the bottom surface bounded by the peripheral support leg and in communication with said volume;

a table including an upper surface engaging said peripheral support leg so as to enclose said volume bounded by said peripheral support leg;

said table including a gas purge opening in said upper surface in communication with said volume; and a gas purge conduit for exhausting purge gas from the volume in communication with said gas purge opening.

5. A gas purge opening according to claim 4, wherein said table is moveable relative to a support device and said gas purge conduit comprises a flexible conduit extending between the support device and the table.

6. The container according to claim 5, said lid bottom including a sidewall having at least one latch receiving opening therein, and at least one additional gas purge opening in said sidewall that does not constitute a latch receiving opening.

7. The container according to claim 5, including at least one cut-out gas purging path formed on the lower side of said peripheral support leg.

8. A gas purging system for purging a portable closeable container for semi-conductor wafers, comprising:

a container body having an opening;

a lid for hermetically opening and sealing the opening, the lid including a bottom having a bottom surface;

a table having an upper surface for engaging the lid bottom surface;

a volume defined by the lid bottom surface and the table upper surface when the table upper surface engages the lid bottom surface;

a gas purge opening in the table upper surface, the gas purge opening being in communication with said volume defined by the table upper surface and the lid bottom surface when the lid is supported on the table upper surface; and a gas purge conduit for exhausting purge gas in communication with said purge gas opening.

9. A gas purging system according to claim 8, wherein said table is movable relative to a support device and said gas purge conduit comprises a flexible conduit extending between the support device and the table.

10. A gas purging system according to claim 8, wherein the interior of said lid is hollow and said lid includes a gas purge opening in the bottom surface in communication with the hollow lid interior and in communication with said gas purge opening in the table upper surface via said volume.

11. A gas purging system for purging a portable closeable container for semi-conductor wafers, comprising:

a container body having an opening;

a lid for hermetically closing and sealing the opening, the lid comprising a hollow body having a bottom surface and a peripheral support leg on the bottom surface extending below the bottom surface to effectively create a volume beneath the lid bottom surface bounded by the peripheral support leg;

at least one unrestricted gas purge opening in the bottom surface within the area of the bottom surface bounded by the peripheral support leg and in communication with said volume;

a table including an upper surface engaging said peripheral support leg so as to enclose said volume bounded by said peripheral support leg;

said table including a central internal area supporting a cam operated device having a cam shaft extending through a cam shaft opening in the table upper surface, said opening being larger than said cam shaft and said cam shaft opening communicating with said volume bounded by said peripheral support leg to define a purge gas opening;

a gas purge conduit in communication with said purge gas opening and extending to an area outside said table internal area;

whereby purge gas can flow into the internal table area via said volume bounded by said peripheral support leg, said cam shaft opening and out of said internal area via said gas purge conduit.

12. A gas purging system according to claim 11, wherein said table is movably mounted relative to a support device and said gas purge conduit is a flexible conduit extending between said table and said support device.

13. A gas purging system according to claim 11, wherein said table is supported by a support device comprising wall elements defining a sealable chamber and said gas purge conduit provides communication between said table interior area and an area outside said chamber.

14. A gas purging system according to claim 13, wherein said table is movably mounted relative to said support device and said gas purge conduit is a flexible conduit extending between said table and said support device.

* * * * *